(12) United States Patent
Oertle et al.

(10) Patent No.: US 7,199,612 B2
(45) Date of Patent: Apr. 3, 2007

(54) METHOD AND CIRCUIT FOR REDUCING HCI STRESS

(75) Inventors: Kent Oertle, Phoenix, AZ (US); Robert Elio, Mesa, AZ (US); Duncan McFarland, Tempe, AZ (US); Darrin Benzer, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/611,585

(22) Filed: Jul. 1, 2003

(65) Prior Publication Data

US 2004/0027161 A1    Feb. 12, 2004

Related U.S. Application Data

(60) Provisional application No. 60/402,770, filed on Aug. 12, 2002, provisional application No. 60/402,771, filed on Aug. 12, 2002.

(51) Int. Cl.
*H03K 19/0175* (2006.01)

(52) U.S. Cl. ............................ 326/81; 326/83; 326/26

(58) Field of Classification Search ............ 326/80–86, 326/89, 26, 27
See application file for complete search history.

(56) References Cited

U.S. PATENT DOCUMENTS

| | | | |
|---|---|---|---|
| 5,381,059 A * | 1/1995 | Douglas ...................... | 326/58 |
| 5,721,508 A | 2/1998 | Rees | |
| 5,748,011 A * | 5/1998 | Takahashi et al. ............. | 326/83 |
| 5,952,875 A * | 9/1999 | Yosefin et al. ............... | 327/545 |
| 6,018,257 A * | 1/2000 | Hung et al. .................. | 327/112 |
| 6,081,412 A * | 6/2000 | Duncan et al. ............... | 361/86 |
| 6,118,301 A * | 9/2000 | Singh et al. .................. | 326/58 |
| 6,130,556 A | 10/2000 | Schmitt et al. | |
| 6,198,316 B1 * | 3/2001 | Krolak et al. ................ | 327/112 |
| 6,236,235 B1 * | 5/2001 | Arai et al. ..................... | 326/81 |
| 6,377,075 B1 * | 4/2002 | Wong ........................... | 326/83 |
| 6,414,515 B1 * | 7/2002 | Kunz et al. .................... | 326/81 |
| 6,674,304 B1 * | 1/2004 | Matthews ..................... | 326/80 |
| 6,788,107 B2 * | 9/2004 | Wang ........................... | 326/81 |
| 6,856,176 B2 * | 2/2005 | Ajit ............................. | 327/108 |

FOREIGN PATENT DOCUMENTS

EP    0862267    2/1998

* cited by examiner

*Primary Examiner*—Don Le
(74) *Attorney, Agent, or Firm*—McAndrews, Held & Malloy Ltd.

(57) ABSTRACT

Systems and methods are disclosed for reducing or eliminating hot carrier injection stress in circuits. In one embodiment, the present invention relates to an integrated circuit comprising an IO PAD, an output circuit coupled to at least the IO PAD and a stress circuit. The stress circuit is coupled to at least the output circuit and is adapted to limit a high voltage across the output circuit when the output circuit is enabled, thereby reducing stress on the output circuit. In one embodiment, the stress circuit comprises at least one transistor device (a p-channel device or two stacked p-channel devices, for example) and the output circuit comprises a transistor device (an n-channel device or two stacked n-channel devices).

5 Claims, 4 Drawing Sheets

METHOD AND CIRCUIT FOR REDUCING HCI STRESS

CROSS-REFERENCE TO RELATED APPLICATIONS

This application is related to, and claims benefit of and priority from, Provisional Application Ser. No. 60/402,770 filed on Aug. 12, 2002, titled "A Method and Circuit for Reducing HCI Stress", the complete subject matter of which is incorporated herein by reference in its entirety.

Further Provisional Application Ser. No. 60/402,771 filed on Aug. 12, 2002, titled "A 5 Volt Tolerant IO Scheme Using Low Voltage Devices" and patent application Ser. No. 10/370,392 filed on Feb. 19, 2003, titled "A 5 Volt Tolerant IO Scheme Using Low Voltage Devices" are each incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

The present invention relates to a circuit and method for reducing stress on an output device. More specifically, the present invention relates to an HCI stress circuit and method using low voltage devices adapted to limit voltage across an output device, thereby reducing HCI stress.

In modern CMOS ASIC designs, the core circuitry generally operates at a lower voltage than the IO circuits. This provides a core circuitry design that operates at higher speeds with lower power consumption. However, since the maximum operating voltage of such current CMOS ASIC core circuitry designs is also lower, these devices may not be used directly with currently known IO circuits without special design considerations. In particular, stress on the IO circuits must be taken into consideration when designing CMOS ASIC circuits.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in a design method and circuit enabling IO devices in a CMOS ASIC design to utilize more efficient transistors while not subjecting such devices to stress.

More specifically, one embodiment of the present invention relates to a circuit coupled to an output device, where the circuit comprises at least one transistor device adapted to limit a duration of a high voltage across the output device, thereby reducing hot carrier injection stress. In one embodiment, the circuit comprises a p-channel transistor or device coupled to the output device, while in another embodiment the circuit comprises two stacked transistor devices (stacked p-channel transistors or devices for example) coupled to the output device (an n-channel output transistor or device for example).

In another embodiment, the present invention relates to an integrated circuit comprising an output circuit and a stress circuit coupled to at least the output circuit. The stress circuit is adapted to limit a duration of a high voltage across the output circuit, thereby reducing hot carrier injection stress. In one embodiment, the stress circuit comprises stacked transistor devices.

In another embodiment, the present invention relates to an integrated circuit comprising an IO PAD, an output circuit coupled to at least the IO PAD and a stress circuit. The stress circuit is coupled to at least the output circuit and is adapted to limit a duration of a high voltage across the output circuit when the output circuit is enabled, and the PAD voltage is greater than VDDO thereby reducing stress on the output circuit. In one embodiment, the stress circuit comprises at least one transistor device (a p-channel transistor or device or two stacked p-channel transistors or devices, for example) and the output circuit comprises a transistor device (an n-channel transistor or device or two stacked n-channel transistors or devices).

Yet another embodiment of the present invention relates to a method of controlling hot carrier injection stress. In this embodiment, the method comprises limiting a duration of a high voltage across an output device when said output device is enabled.

Yet still another embodiment relates to a method of reducing stress across an output circuit. In this embodiment, the method comprises determining if the output circuit is tri-stated and determining if a PAD voltage is greater than a predetermined voltage level. The method further comprises enabling the output circuit, turning on a stress circuit that dissipates voltage across the output circuit while the output circuit transitions to a low state, thereby preventing the output circuit form experiencing HCI stress.

Still another embodiment relates to a method of reducing hot carrier injection stress in an integrated circuit. This method comprises enabling an output device in the integrated circuit; and limiting a duration of a high voltage across an output device coupled to at least the IO PAD.

These and other advantages and novel features of the present invention, as well as details of an illustrated embodiment thereof, will be more fully understood from the following description and drawings.

DETAILED DESCRIPTION OF THE INVENTION

The following description is made with reference to the appended figures.

Figure 1:
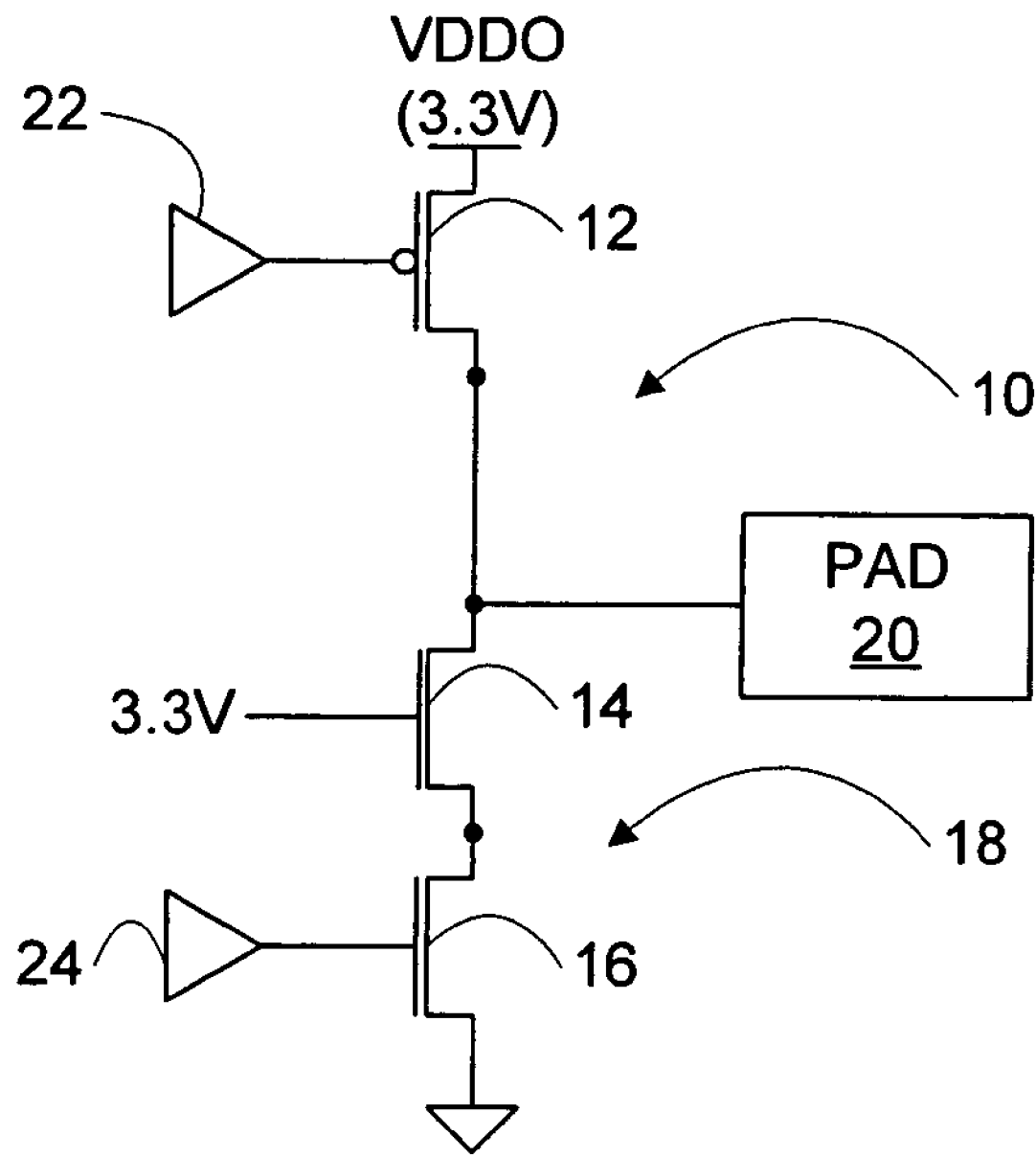
FIG. 1 illustrates one example of a circuit diagram of a portion of an integrated circuit having an output circuit coupled to an IO PAD.

FIG. 1 illustrates one example of integrated circuit, generally designated 10, comprising three transistor devices, one PMOS device 12 and two NMOS devices 14 and 16. In this example, devices 14 and 16 form an output device or circuit, generally designated 18. IO PAD 20 is shown coupled to at least device 12 and output device 18. It is contemplated that the IO PAD 20 is coupled to, and driven by, external circuitry via a bus (not shown) when integrated circuit 10 is tri-stated or turned off. Two pre-driver devices 22 and 24 are illustrated, coupled to PMOS device 12 and NMOS device 16 respectively. It is contemplated that, in this embodiment, device 12 is a floating well transistor device.

Tri-stating the circuit 10 means that the output device 18 and the device 12 are tri-stated (i.e., turned off). When output device 18 and device 12 are tri-stated or turned off, the bus takes over, driving the IO PAD 20 and output device 18 to the high voltage (5.5V for example). In the illustrated example, when the circuit 10 is enabled, devices 14 and 16 turn on, pulling IO PAD 20 from the high voltage to ground, placing a great amount of stress more specifically hot carrier injection (alternatively referred to as "HCI") stress on devices 14 and 16. It is desirable to limit the amount of time the high voltage appears across the output device 18.

Figure 2:
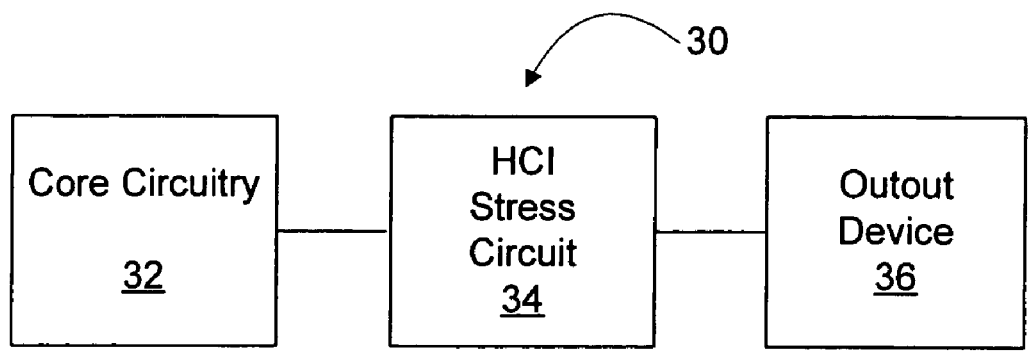
FIG. 2 illustrates a block diagram of one embodiment of an integrated circuit in accordance with the present invention.

FIG. 2 illustrates a block diagram of one embodiment of an integrated circuit, generally designated 30, in accordance with the present invention. In the illustrated embodiment, the integrated circuit 30 comprises at least core circuitry 32 and output device 36 which is adapted to be coupled to, and driven by, external circuitry via a bus (not shown).

In CMOS design, the core circuitry 32 generally operates at a lower voltage than the PAD voltage. For example, a high voltage (about 5.5V) may be applied to the output device 36, but a lower voltage (about 2.5V for example) is applied across the junctions in the core circuitry 32.

In this embodiment, a HCI stress circuit, generally designated 34, is illustrated coupled to both the core circuitry 32 and the output device 36. The stress circuit 34 is adapted to limit the amount of time the high voltage appears across the output device 36, thereby reducing or eliminating HCI stress.

Figure 3:
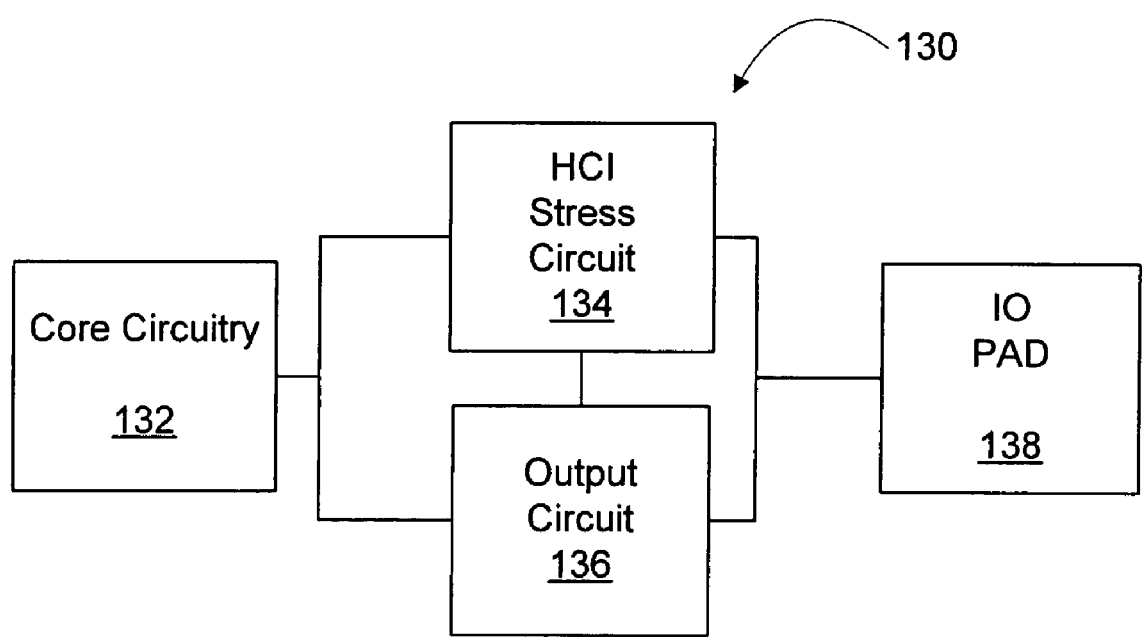
FIG. 3 illustrates a block diagram of another embodiment of an integrated circuit similar to that illustrated in FIG. 2 in accordance with the present invention.

FIG. 3 illustrates a block diagram of another embodiment of an integrated circuit, generally designated 130, in accordance with the present invention. In the illustrated embodiment, the integrated circuit 130 comprises at least core circuitry 132, output circuit or device 136 and IO PAD 138 which is adapted to be coupled to, and driven by, external circuitry via a bus (not shown).

Again, the core circuitry 132 generally operates at a lower voltage than the PAD voltage. In this embodiment, an HCI stress circuit, generally designated 134, is illustrated coupled to the core circuitry 132, the output device or circuit 136 and the IO PAD 138. The stress circuit 134 is adapted to limit the amount of time the high voltage appears across the output device 136 when the output device 136 is enabled, thereby reducing or eliminating HCI stress.

Figure 4:
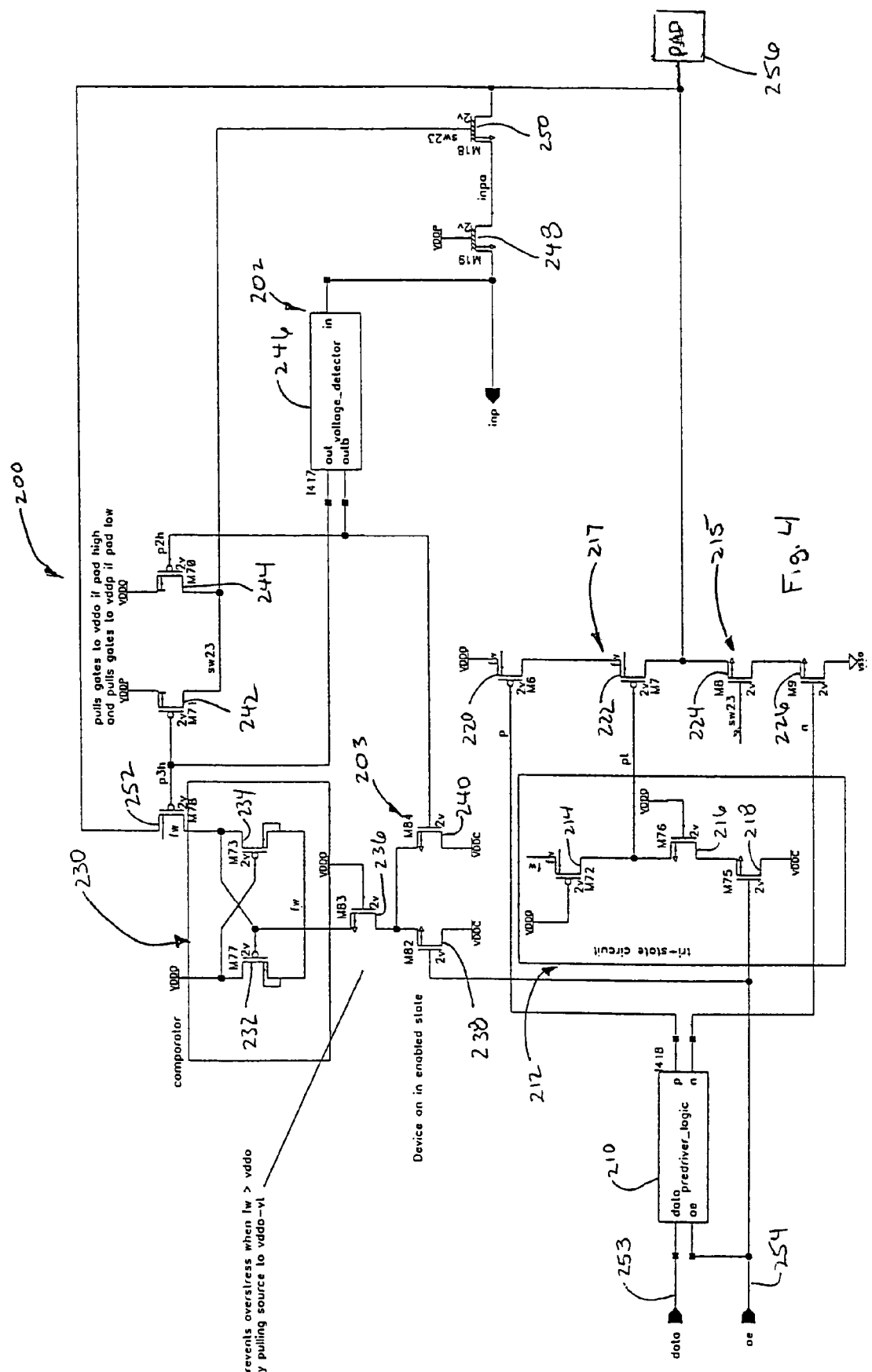
FIG. 4 illustrates a circuit diagram of an HCI stress circuit in accordance with the present invention.

One embodiment of an integrated circuit, generally designated 200, is illustrated in FIG. 4. In accordance with the present invention, this embodiment comprises at least a voltage detect circuit, generally designated 202, adapted to detect when a voltage is sufficient to switch bias conditions without violating the maximum transistor operating conditions for the process; a comparator or comparator circuit, generally designated 230, adapted to determine when the PAD voltage is greater than the IO power supply voltage; a tri-state circuit 212 adapted to ensure one or more device(s) coupled to at least the IO PAD 256 will not turn on, and circuits 215 and 217 will not be overstressed when the PAD voltage exceeds the IO power supply voltage; output device or circuit 215; and an HCI stress device or circuit 217, adapted to limit the amount of time a high voltage appears across the output device 215 when IO PAD 256 transitions from a tri-state voltage to $V_{PAD}$=GND.

In accordance with one embodiment, an overstress circuit, generally designated 203, prevents overstress of the circuit 200 when the floating well (alternatively referred to as "fw") is greater than VDDO, by turning off and allowing a source of at least one device to pull up to VDDO−$V_t$. In this embodiment, the overstress circuit 203 comprises at least one, but generally three, transistor devices, such as three NMOS or n-channel transistor devices 236, 238 and 240 for example.

In the illustrated embodiment, the voltage detect circuit 202 is adapted to detect when a voltage is sufficient to switch the bias conditions without violating maximum transistor operating conditions for the process. In the circuit 200 illustrated in FIG. 4, the voltage detect circuit comprises a voltage detect device 246 having an input coupled to device 248 and node inp, a node out output coupled to node p3h, and PMOS devices 242 and 252, and a node outb coupled to NMOS device 240 and PMOS device 244. In this embodiment, it is contemplated that the voltage detect device 246 is adapted to determine whether the PAD voltage is high or low (i.e., the in signal and out signal of the detect device 246 are the same and the outb signal is the opposite of the out signal).

The integrated circuit 200 also comprises the comparator circuit 230 adapted to determine when the PAD voltage is greater than the IO power supply voltage. In this embodiment, the comparator 230 comprises at least one, but generally two or more devices, such as two PMOS or p-channel transistor devices 232 and 234 for example.

This embodiment further comprises tri-state circuit 212 adapted to guarantee that a device, such as a PMOS or p-channel transistor device 222 for example, will not turn on when the PAD voltage exceeds the IO power supply voltage. In this embodiment, the tri-state circuit 212 comprises at least one, but generally three, devices, such as a PMOS or p-channel transistor device 214 and two NMOS or n-channel transistor devices 216 and 218.

In the embodiment illustrated in FIG. 4 an output device or circuit 215 is illustrated coupled to or communicating with at least pre-driver logic device 210 and IO PAD 256. In the illustrated embodiment, the output device 215 comprises at least one but generally two devices. Here, the output device 215 comprises two stacked n-channel or NMOS devices 224 and 226, although other devices are contemplated.

FIG. 4 further illustrates an HCI stress device or circuit 217, adapted to limit the high voltage across output device or circuit 215 when the IO PAD 256 is transitioning from a tri-state voltage, $V_{PAD}$>VDDO, to an enabled state of $V_{PAD}$=GND, reducing stress thereon. In this embodiment, the stress device or circuit 217 comprises at least one but generally two devices. Here, the stress device 217 comprises two stacked p-channel or PMOS devices 220 and 222, although other devices are contemplated.

One embodiment of the present invention comprises at least one, but generally two or more power supplies. In the illustrated embodiment, three power supplies are contemplated; the core power supply or VDDC, the intermediate power supply, or VDDP, and the IO power supply or VDDO. VDDP is set to the maximum IO device voltage (i.e., less than VDDO for example). It is contemplated that setting VDDP to the maximum IO device voltage limits the maximum voltage across any device, maintaining gate oxide reliability and avoiding hot carrier injection or HCI stress. In this illustrated embodiment, it is contemplated that the PAD voltage will not exceed a pre-determined amount (two times for example) the maximum device voltage and VDDO–VDDC will not exceed the maximum device voltage.

The circuit 200 further comprises a node sw23, coupled to at least one but generally two or more devices, PMOS or p-channel transistor 242 and 244 for example. Nodes p3*h* and p2*h* and devices 242 and 244 are adapted to pull node sw23 to VDDO if the PAD voltage is high, and to VDDP if the PAD voltage is low. IO PAD 256 is illustrated coupled to at least sw23 and transistor device 250.

In accordance with one embodiment of the present invention where the PMOS driver is tri-stated, HCI stress may be significantly reduced when the output is enabled with the PAD at 5.5V. For example, if the PAD is at 5.5V and the output is enabled with the data low, a very large Vds voltage appears on devices 224 and 226 resulting in HCI stress on devices 224 and 226 as they are on. In accordance with the present invention, node pt pulls low and device 222 is turned on when the output is enabled. Since the PAD voltage is greater than VDDO, device 220 is also on, dissipating some of the charge through devices 222 and 220, limiting the amount of time the high voltage appears across the output device. Since s23 is at VDDO, device 224 is not stressed even when the PAD is at 5.5V.

The circuit 200 further comprises a pre-driver logic device 210, which is adapted to generate one or more logic states that drive the stacked output devices. The pre-driver logic device 210 is coupled to nodes data 253 and output enable node (alternatively referred to as "oe") 254, and the stacked output devices. In this embodiment, nodes data 253 and oe 254 are coupled to the core circuitry (not shown).

Figure 5:
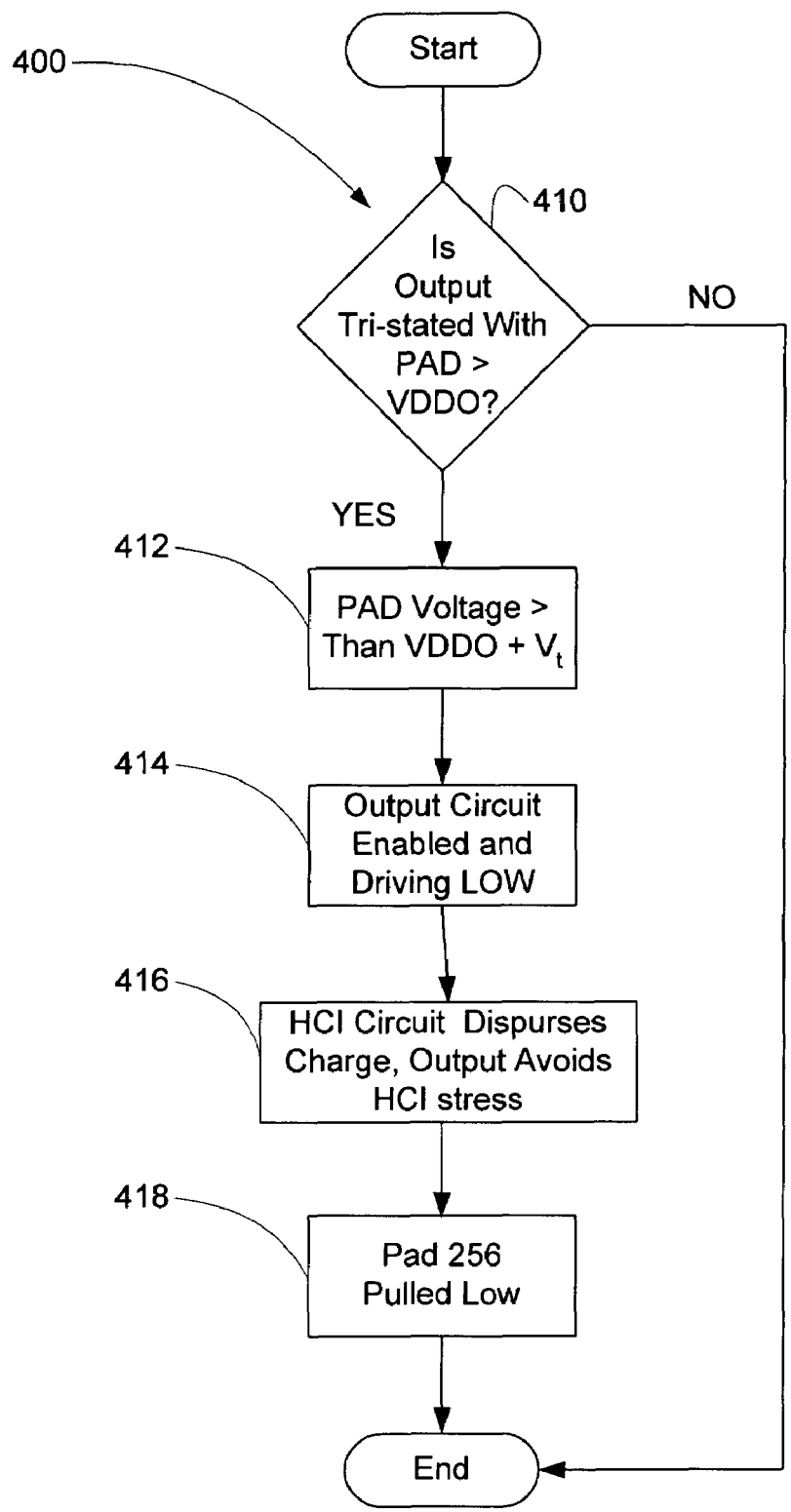
FIG. 5 illustrates a high level flow chart of one method of limiting a high voltage across an output circuit, thereby reducing or eliminating stress in accordance with the present invention.

FIG. 5 illustrates one method of reducing HCI stress by limiting the duration of the high voltage across an output device when the output device is enabled. FIG. 5 illustrates one method of reducing HCI stress, generally designated 400, wherein the method determines if the output is tri-stated with PAD>VDDO as illustrated by diamond 410.

Block 412 illustrates when PAD>VDDO+$V_t$, where $V_t$ is the threshold of the PMOS device. Block 414 illustrates when the output circuit is enabled and driving LOW. The HCI stress circuit turns on, dispersing or dissipating the charge across the output circuit so that the output circuit avoids HCI stress and pulls Pad 256 LOW as illustrated by blocks 416 and 418.

It is contemplated that the HCI stress circuit, and a method of reducing HCI stress in accordance with the present invention provides/includes one or more of the following advantages and features: (1) enables lower power and high speed design of core/analog circuits; (2) simplifies fabrication process and cost; and (3) reduces HCI stress on the NMOS output driver.

Many modifications and variations of the present invention are possible in light of the above teachings. Thus, it is to be understood that, within the scope of the appended claims, the invention may be practiced otherwise than as described hereinabove.

The invention claimed is:

1. A method of reducing stress across an output circuit, comprising:
   determining if the output circuit is tri-stated;
   determining if a PAD voltage is greater than a predetermined voltage level;
   enabling the output circuit, wherein the output circuit comprises two stacked n-channel output transistors;
   turning on a stress circuit comprising at least one p-channel transistor, dissipating a voltage across the output circuit, wherein the at least one p-channel transistor comprises a first p-channel transistor and a second p-channel transistor, wherein a drain of the first p-channel transistor is coupled to a source of the second p-channel transistor; and
   preventing the output circuit from experiencing HCI stress.

2. The method of claim 1, wherein said at least one p-channel transistor is coupled to the output circuit.

3. An HCI stress circuit coupled to both an output circuit and an IO pad, the HCI stress circuit consisting of two stacked p-channel transistor devices, said two stacked p-channel transistor devices adapted to limit a duration of a high voltage across the output circuit thereby reducing hot carrier injection stress across the output circuit.

4. The HCI stress circuit of claim 3, wherein at least one of said two stacked p-channel transistor devices is coupled to the output circuit.

5. The HCI stress circuit of claim 3, wherein the output device comprises at least one n-channel output transistor circuit.

* * * * *